United States Patent [19]

Moller et al.

[11] Patent Number: 5,828,247
[45] Date of Patent: Oct. 27, 1998

[54] EXTERNALLY MULTI-CONFIGURABLE OUTPUT DRIVER

[75] Inventors: David Dale Moller, Westfield; Robert J. Berg, Kokomo, both of Ind.

[73] Assignee: Delco Electronics Corporation, Kokomo, Ind.

[21] Appl. No.: 762,077

[22] Filed: Dec. 9, 1996

[51] Int. Cl.$^6$ ..................................................... H03B 1/00
[52] U.S. Cl. ........................... 327/110; 327/388; 327/427
[58] Field of Search .................................. 327/109, 427, 327/110, 365, 387, 388, 403, 404, 405, 407, 408

[56] References Cited

U.S. PATENT DOCUMENTS 4,977,333   12/1990   Suzuki et al. ........................... 307/243

*Primary Examiner*—Timothy P. Callahan
*Assistant Examiner*—Jeffrey Zweizig
*Attorney, Agent, or Firm*—Jimmy L. Funke

[57] ABSTRACT

In a preferred embodiment, a multi-configurable output driver, including: first circuitry to provide driving current to an inductive load; the first circuitry being configurable, without the addition or rearrangement of components, in at least two different output topographies; and second circuitry to configure the first circuitry in a selected one of the at least two different output topographies in response to input signals.

10 Claims, 8 Drawing Sheets

EXTERNALLY MULTI-CONFIGURABLE OUTPUT DRIVER

BACKGROUND OF THE INVENTION

1. Field of the Invention

The present invention relates to output drivers generally and, more particularly, but not by way of limitation, to a novel multi-configurable output driver which is configurable as an internal high or low side driver or as an external high or low side driver.

2. Background Art

A switched inductive load, such as may be present in pulse-width-modulated drive systems, require the dissipation of the flyback current that is generated in the load as the magnetic field created therein collapses upon removal of the driving current. Since the driver and load may take one of a number of configurations, a specific arrangement is conventionally provided unique to any one configuration to provide for dissipation of the flyback current. Thus, each arrangement requires that a specific circuit be designed for the arrangement. It would be desirable to have a single circuit that is easily configurable to provide for dissipation of flyback current upon switching of current to an inductive load for a plurality of driver configurations. Furthermore, it would be desirable to have such a single circuit that is configurable by means of external control signals.

Accordingly, it is a principal object of the present invention to provide a multi-configurable output driver for the dissipation of flyback current from a switched inductive load, the output driver being configurable by means of external control signals.

It is a further object of the present invention to provide such an output driver that is easily implemented in an output driver integrated circuit.

Other objects of the present invention, as well as particular features, elements, and advantages thereof, will be elucidated in, or be apparent from, the following description and the accompanying drawing figures.

SUMMARY OF THE INVENTION

The present invention achieves the above objects, among others, by providing, in a preferred embodiment, a multi-configurable output driver, comprising: circuit means to provide driving current to an inductive load; said circuit means being configurable, without the addition or rearrangement of components, in at least two different output topographies; and means to configure said circuit means in a selected one of said at least two different output topographies in response to input signals.

BRIEF DESCRIPTION OF THE DRAWING

Understanding of the present invention and the various aspects thereof will be facilitated by reference to the accompanying drawing figures, submitted for purposes of illustration only and not intended to define the scope of the invention, on which.

DETAILED DESCRIPTION OF THE PREFERRED EMBODIMENTS

Figure 1:
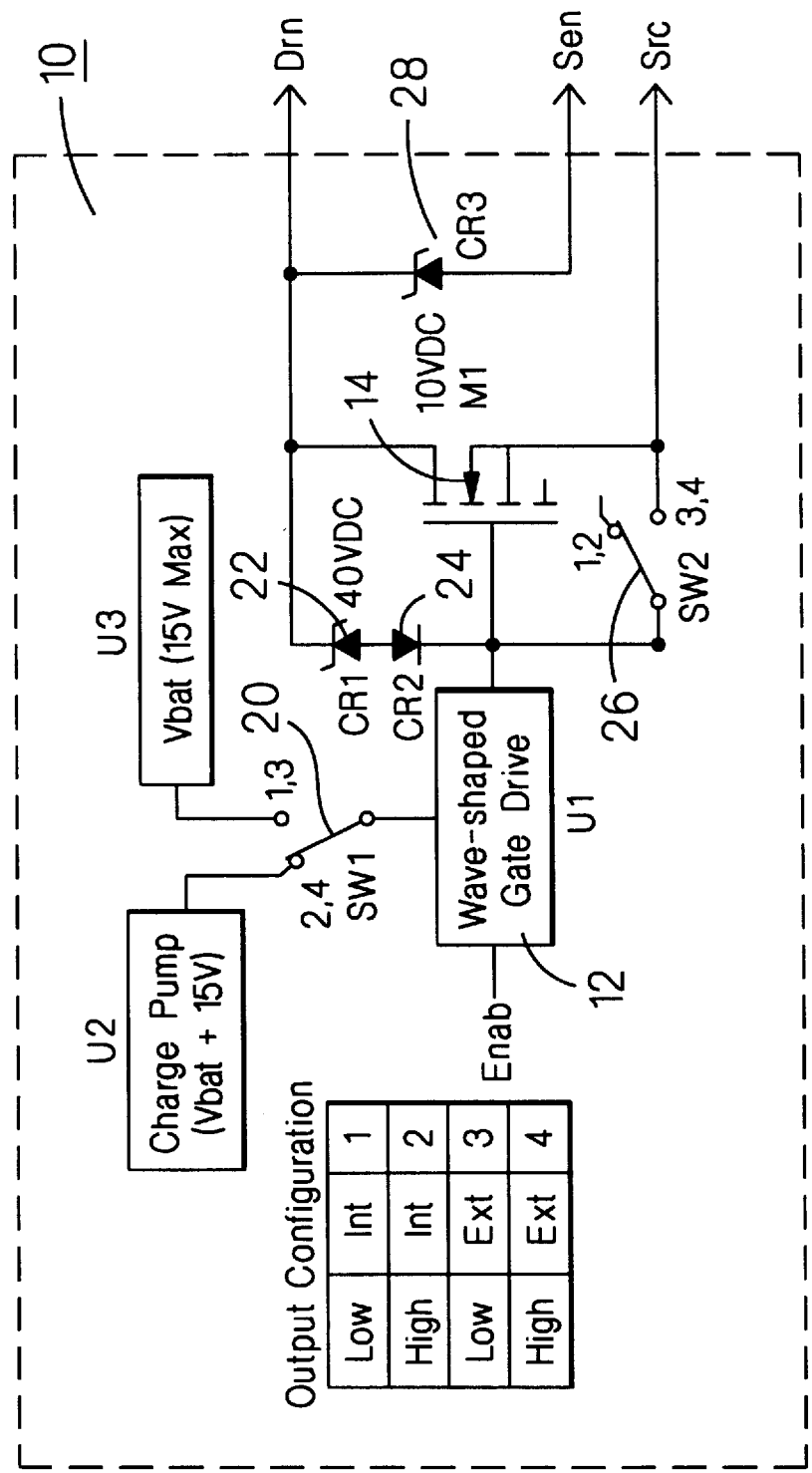
FIG. 1 is a schematic/block diagram showing the basic circuit of the present invention.

Reference should now be made to the drawing figures, on which similar or identical elements are given consistent identifying numerals throughout the various figures.

FIG. 1 illustrates the basic circuit of the present invention, generally indicated by the reference numeral 10, and having Drn, Sen, and Src output connections. Circuit 10 may be part of an integrated circuit (not shown). Circuit 10 includes an internal wave-shaped gate pre-drive circuit (U1) 12 having an enable input and being connected to drive an internal MOSFET (M1) 14. U1 12 is connected to a clamped battery voltage (U3) through a first switch (SW1) 20, if circuit 10 is configured as a low side driver, or is connected to a charge pumped voltage (U2) through SW1 20, if the circuit is operated as a high side driver. The drain of internal MOSFET 14 is connected to the Drn output and first and second zener diodes (CR1) 22 and (CR2) 24, respectively, having their anodes connected are connected in series between the gate of internal MOSFET 14 and the Drn output. The source of internal MOSFET 14 is connected to the Src output and a second switch (SW2) 26 is connected between the gate and source of the MOSFET. SW2 26 is closed, if circuit 10 is operated as an external driver, and is open, if the circuit is operated as an internal driver. A third zener diode (CR3) 28 is connected between the Drn and Sen outputs.

It will be understood that circuit 10 may be implemented in an integrated circuit.

The table on FIG. 1 indicates the positions of SW1 20 and SW2 26 for the four different configurations of circuit 10.

Figure 2:
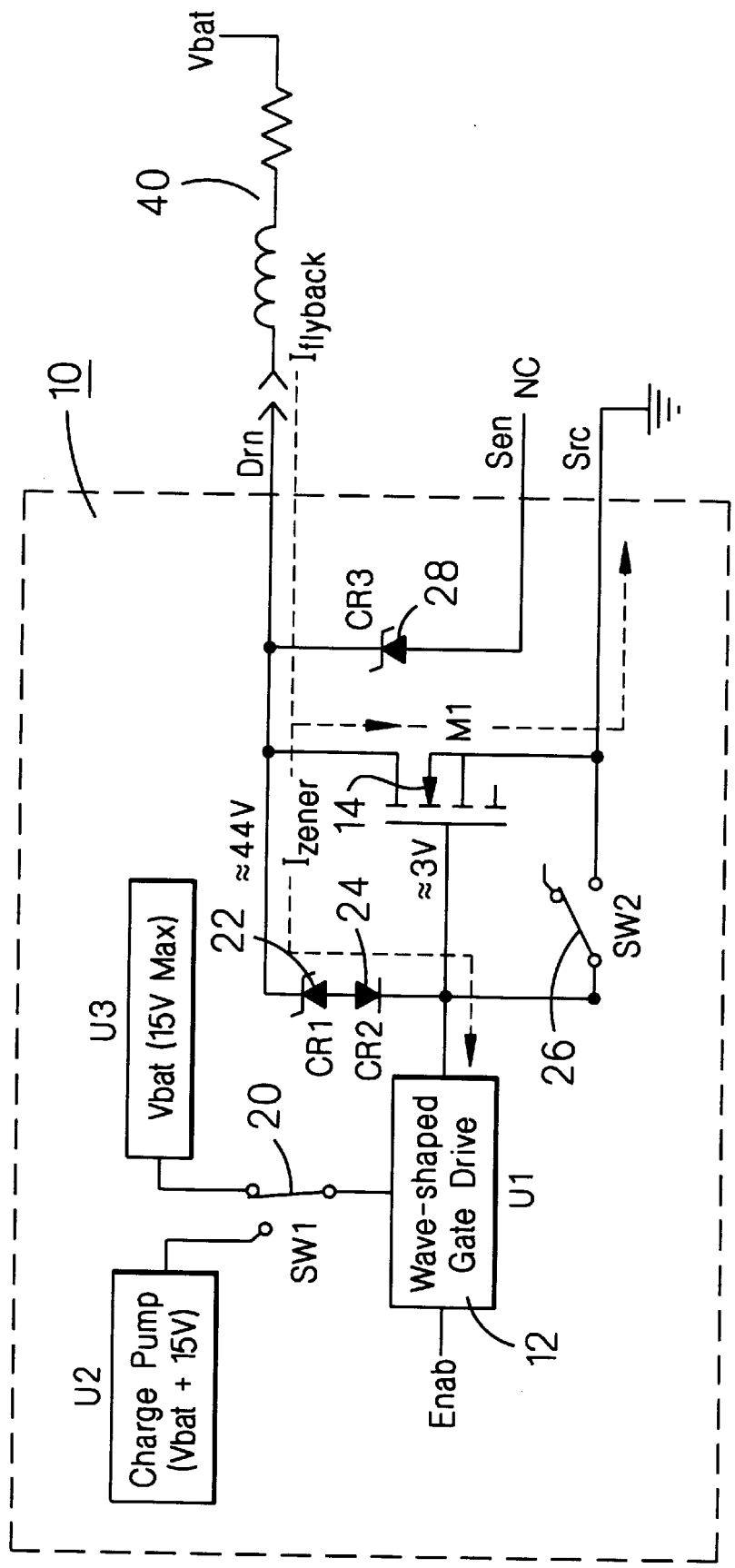
FIG. 2 is a schematic/block diagram showing the basic circuit configured as an internal low side output driver and showing the dissipation path of flyback current.

FIG. 2 illustrates circuit 10 configured as an internal low side driver driving a load 40. Here, the high side of load 40 is connected to a voltage source (Vbat), the low side of the load being connected to the Drn output of circuit 10, the Src output is connected to ground, and the Sen output is left open. SW1 20 is connected to Vbat and SW2 26 is open.

In operation, when U1 12 is enabled, it supplies Vbat to the gate of internal MOSFET 14, enhancing the MOSFET, resulting in a low Drn current, and causing load 40 to conduct current. When disabled, U1 12 will now sink <1 mA of current. The current in inductive load 40 flies back through CR1 22, CR2 24, and U1 12 as is indicated by the broken line path on FIG. 2. CR1 22 and CR2 24 will limit the Drn voltage to about 44 VDC, preventing a drain-to-source breakdown in internal MOSFET 14. The gate of internal MOSFET 14 will go to a voltage of about 3 VDC, which is determined by the threshold voltage and transconductance of the internal MOSFET. The drain and source of internal MOSFET 14 conduct all the flyback current of load 40, less the current that flows to U1 12.

Figure 3:
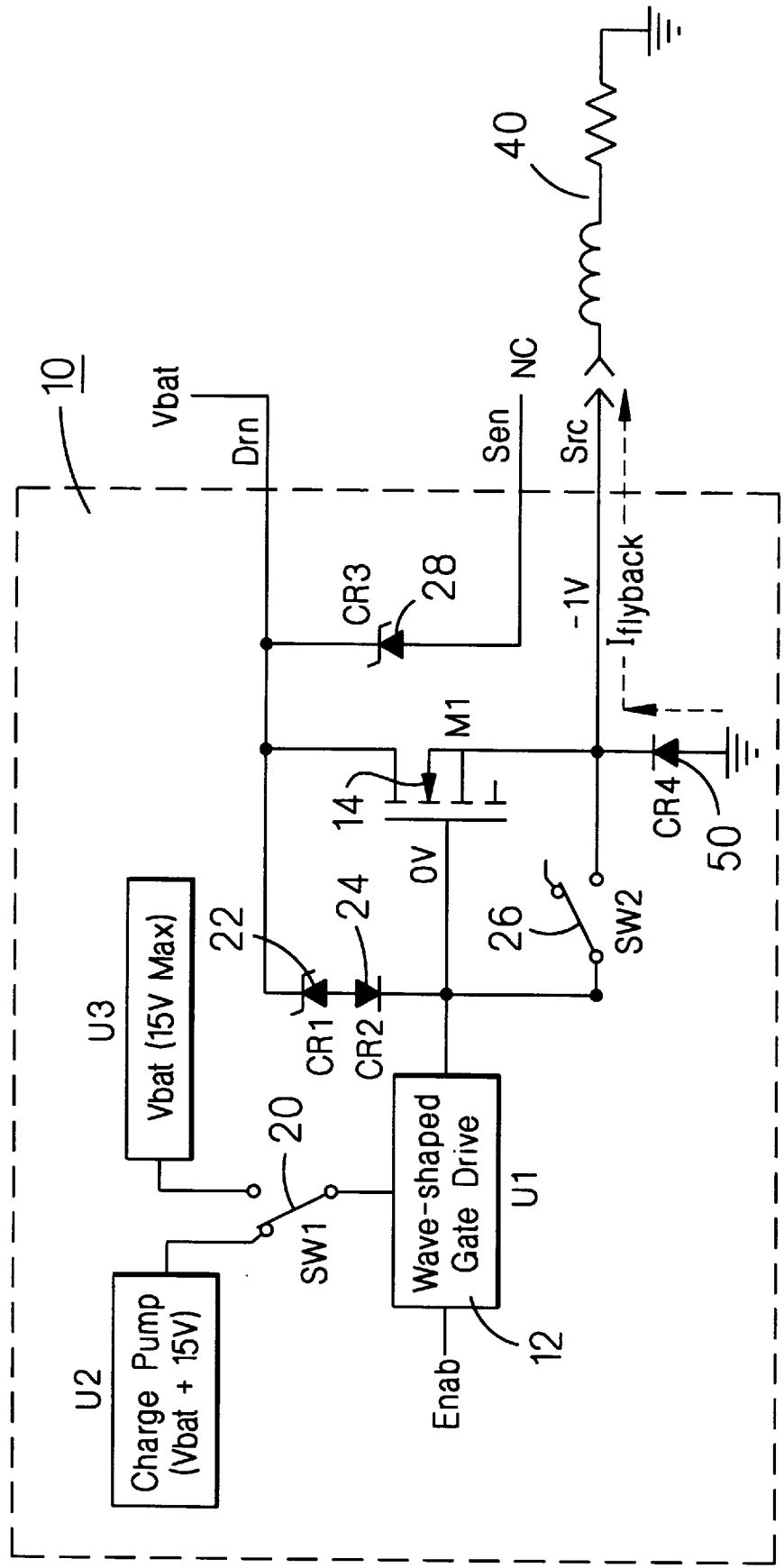
FIG. 3 is a schematic/block diagram showing the basic circuit configured as an internal high side output driver and showing the dissipation path of flyback current.

FIG. 3 illustrates circuit 10 configured as an internal high side output driver. Here, the high side of load 40 is connected to the Src output and the low side of the load is connected to ground. The Drn output is connected to a voltage source (Vbat) and the Sen output is left open circuited.

In operation, when U1 12 is enabled, it supplies pumped voltage (U2) to the gate of internal MOSFET 14, enhancing the MOSFET, resulting in high Src voltage, and causing load 40 to conduct current. When disabled, U1 12 will go low and the current in load 40 will fly back through a parasitic diode (CR4) 50 of MOSFET 14 to ground as is indicated by the broken line path on FIG. 3. The gate of MOSFET 14 will go to a voltage of 0 VDC. Thus, the source of MOSFET 14, i.e., CR4 50 will conduct all the flyback current of load 40.

Figure 4:
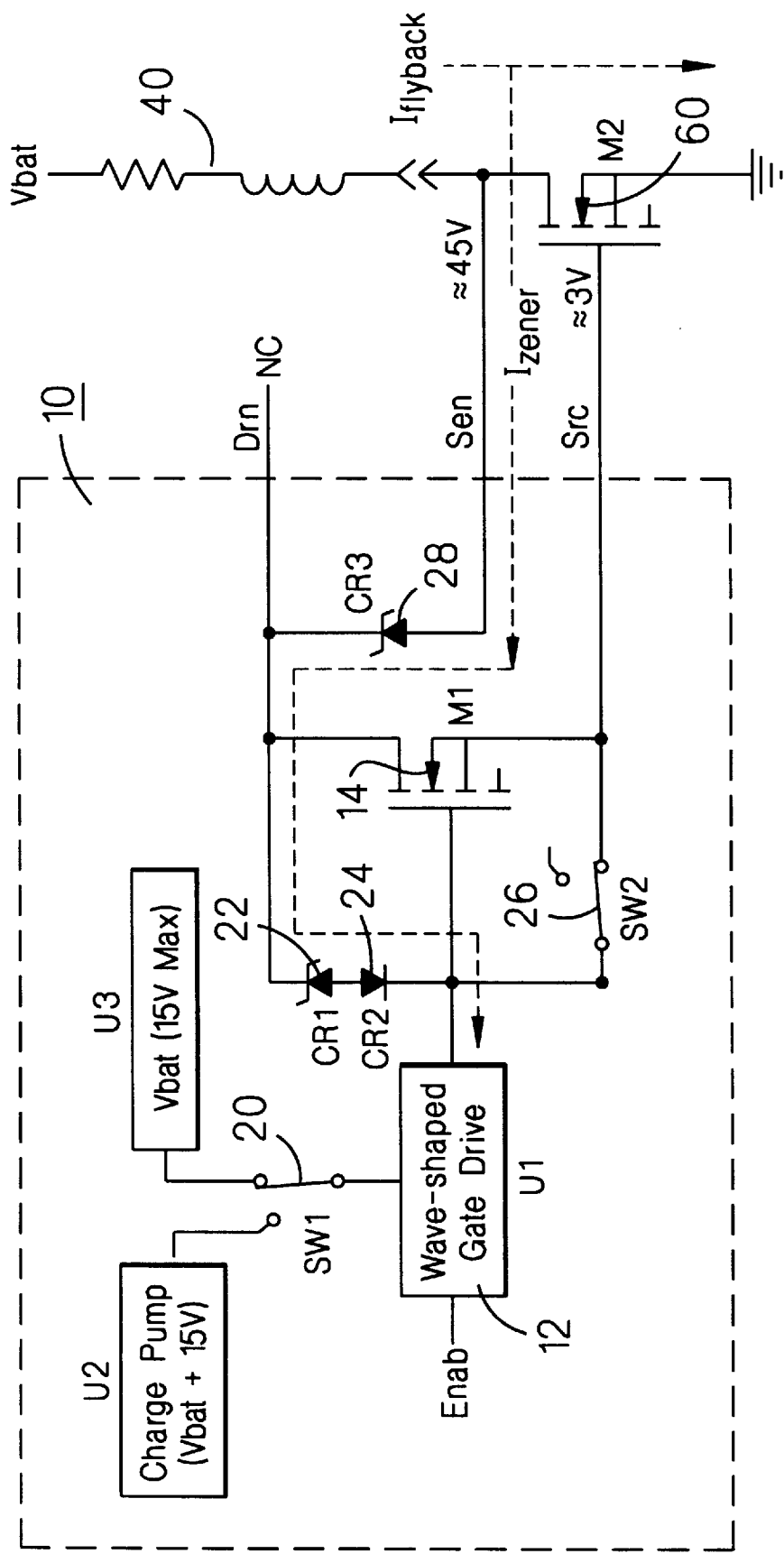
FIG. 4 is a schematic/block diagram showing the basic circuit configured as an external low side output driver and showing the dissipation path of flyback current.

FIG. 4 illustrates circuit 10 configured as an external low side output driver. Here, the high side of load 40 is connected to a voltage source (Vbat). The low side of load 40 is connected to the Sen output and to the drain of an external MOSFET 60. The Src output is connected to the gate of external MOSFET 60. The source of external MOSFET 60 is grounded and the Drn output is left open circuited.

In operation, when U1 12 is enabled, it supplies Vbat (U3) to the gate of external MOSFET 60 through closed SW2 26. This enhances external MOSFET 60, resulting in low external MOSFET drain voltage, and causing load 40 to conduct current. When disabled, U1 12 will now sink <1 mA of current and CR3 28 allows the current in inductive load 40 to flyback through the internal zener diode structure of CR3 28, CR1 22, and CR2 24, and U1 12, as indicated by the broken line path on FIG. 4. The zener diode structure limits the voltage to about 45 VDC, preventing a drain-to-source breakdown in external MOSFET 60. Since SW2 26 is closed, the gate of external MOSFET 60 will go to a voltage of about 3 VDC, which is determined by the threshold voltage and transconductance of the external MOSFET. The drain and source of external MOSFET 60 conduct all the flyback current of load 40 minus the current that goes to U1 12.

Figure 5:
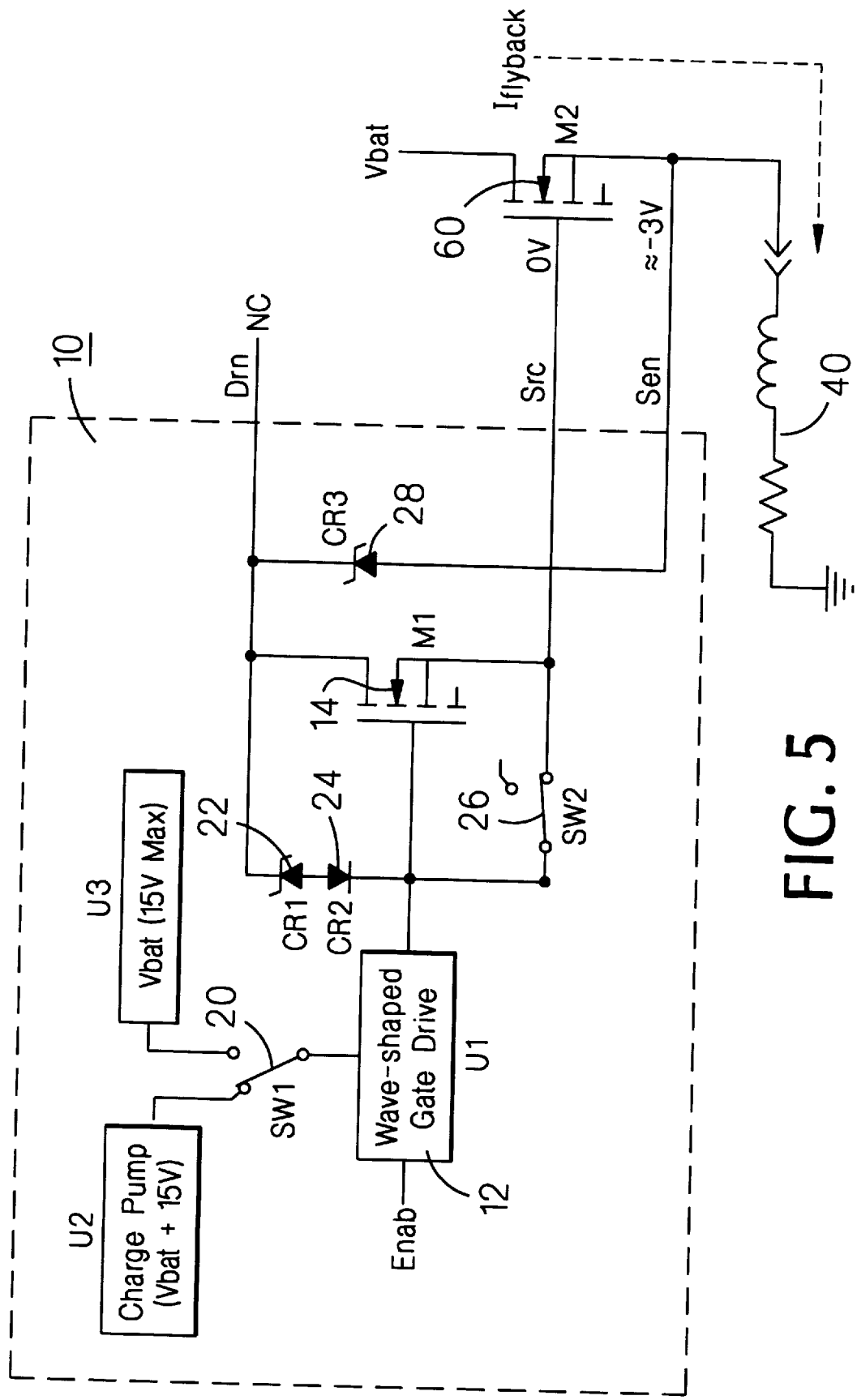
FIG. 5 is a schematic/block diagram showing the basic circuit configured as an internal high side output driver and showing the dissipation path of flyback current.

FIG. 5 illustrates circuit 10 configured as an external high side output driver. Here, the high side of load 40 is connected to the source of external MOSFET 60 and to the Sen output and the low side of the load is connected to ground. A voltage source (Vbat) is connected to the drain of MOSFET 60 and the Src output is connected to the gate of the external MOSFET. The Drn output is left open.

In operation, when U1 12 is enabled, it supplies pumped voltage (Vbat+15) to the gate of external MOSFET 60 through closed SW2 26. This enhances external MOSFET 60, resulting in a high external MOSFET voltage, and causing load 40 to conduct current. When disabled, U1 12 and the gate of external MOSFET 60 will go to 0 VDC (since SW2 26 is closed). The source of external MOSFET 60 will go to a voltage of about −3 VDC, which is determined by the threshold voltage and transconductance of external MOSFET 60. The current in load 40 flies back through the drain and source of external MOSFET 60 as is indicated by the broken line path on FIG. 5.

Figure 6:
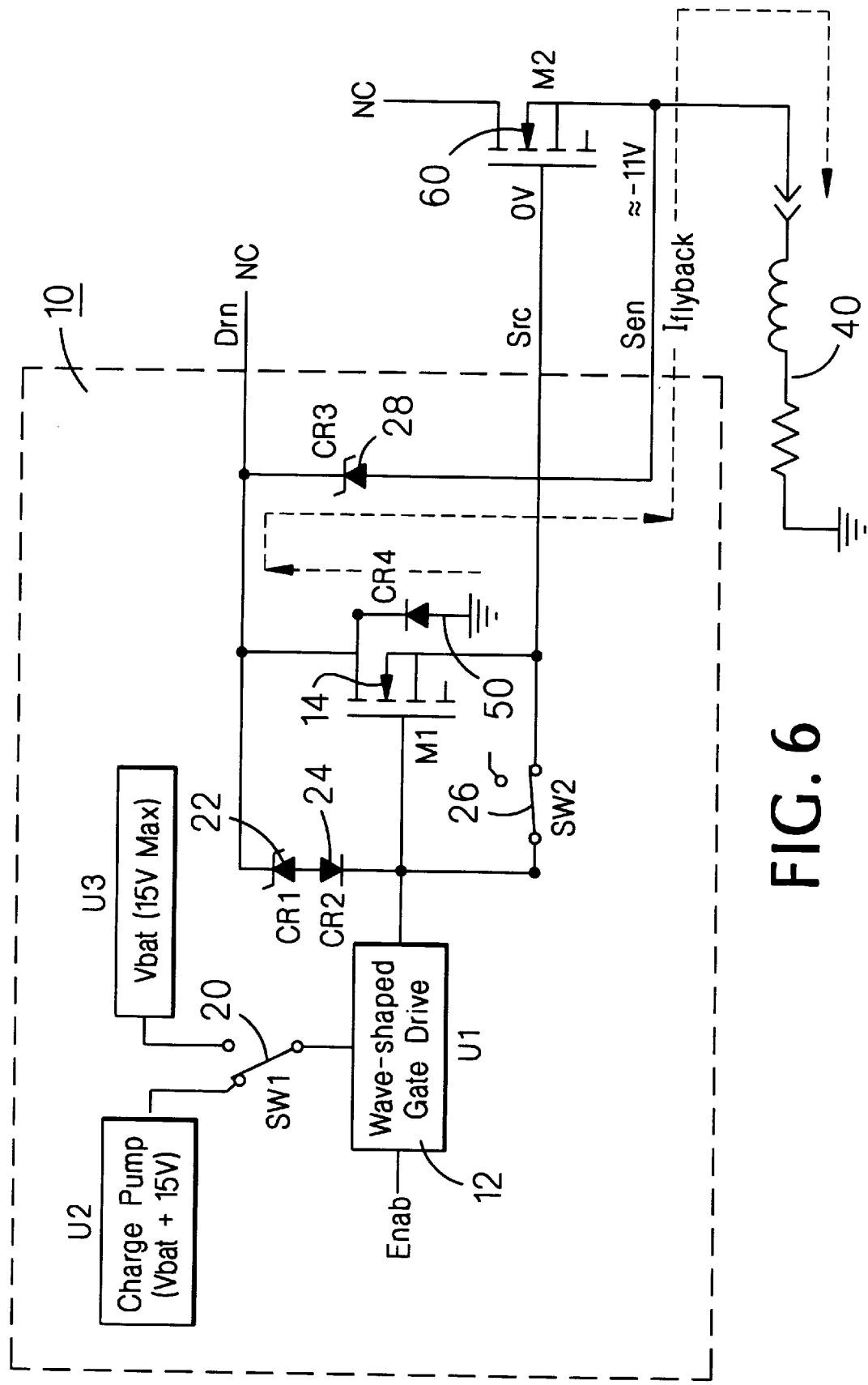
FIG. 6 is a schematic/block diagram showing the basic circuit configured as an external high side output driver and showing the dissipation path of flyback current during loss of battery voltage.

FIG. 6 illustrates the path of flyback current in load 40 when Vbat is lost to the drain of external MOSFET 60. Here, as is indicated by the broken line path on FIG. 6, all of the flyback current in load 40 flies back through parasitic drain-to-substrate diode 50 of internal MOSFET 14 and through zener diode 28. This clamps the maximum voltage at the drain of external MOSFET 60 to about −11 VDC. Since the gate of external MOSFET 60 will go to a voltage of 0 VDC, this protects against a gate-to-source breakdown in external MOSFET 60.

Figure 7A:
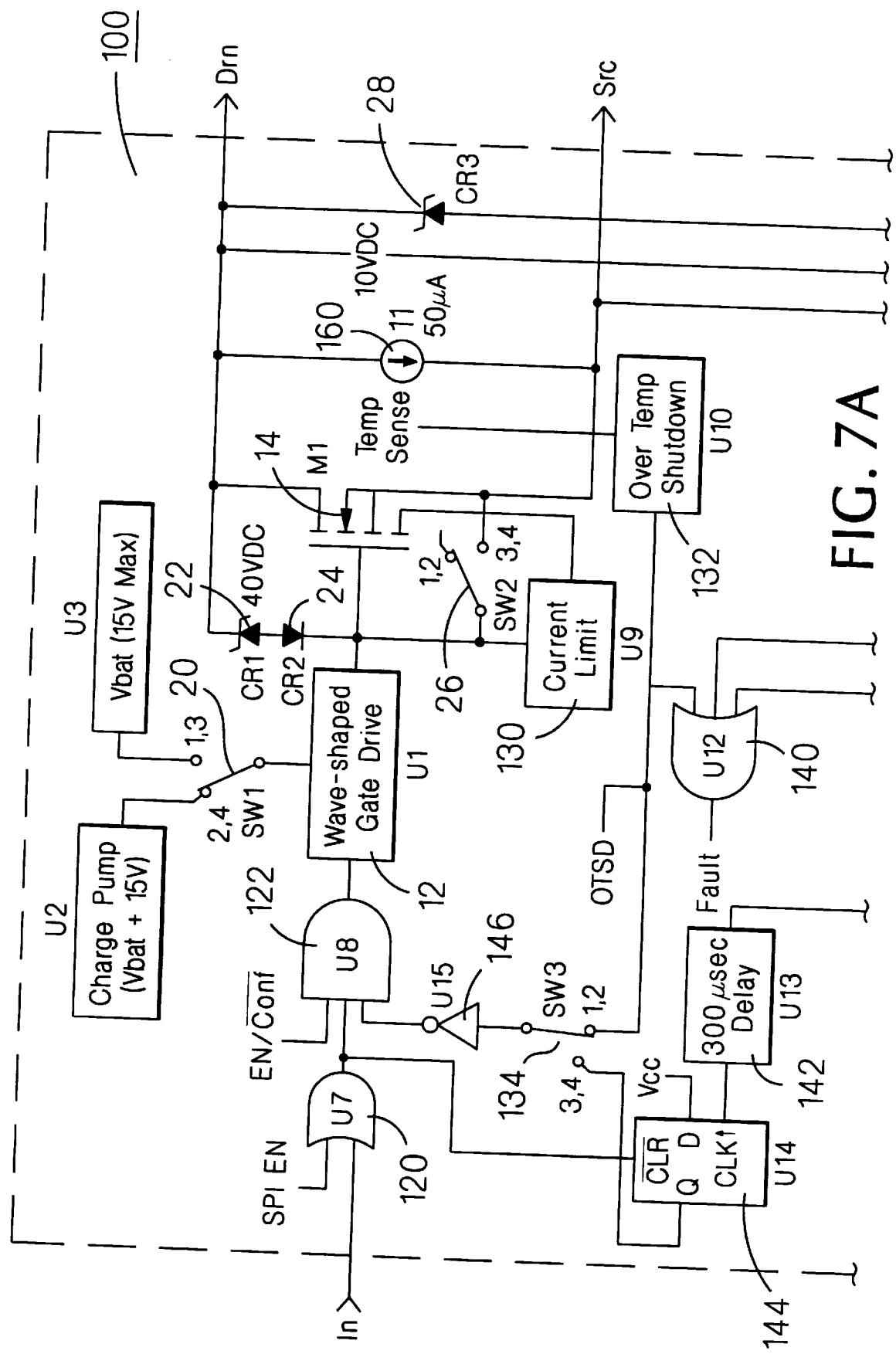
FIGS. 7A and 7B together comprise the basic circuit with configuration control circuitry.
Figure 7B:
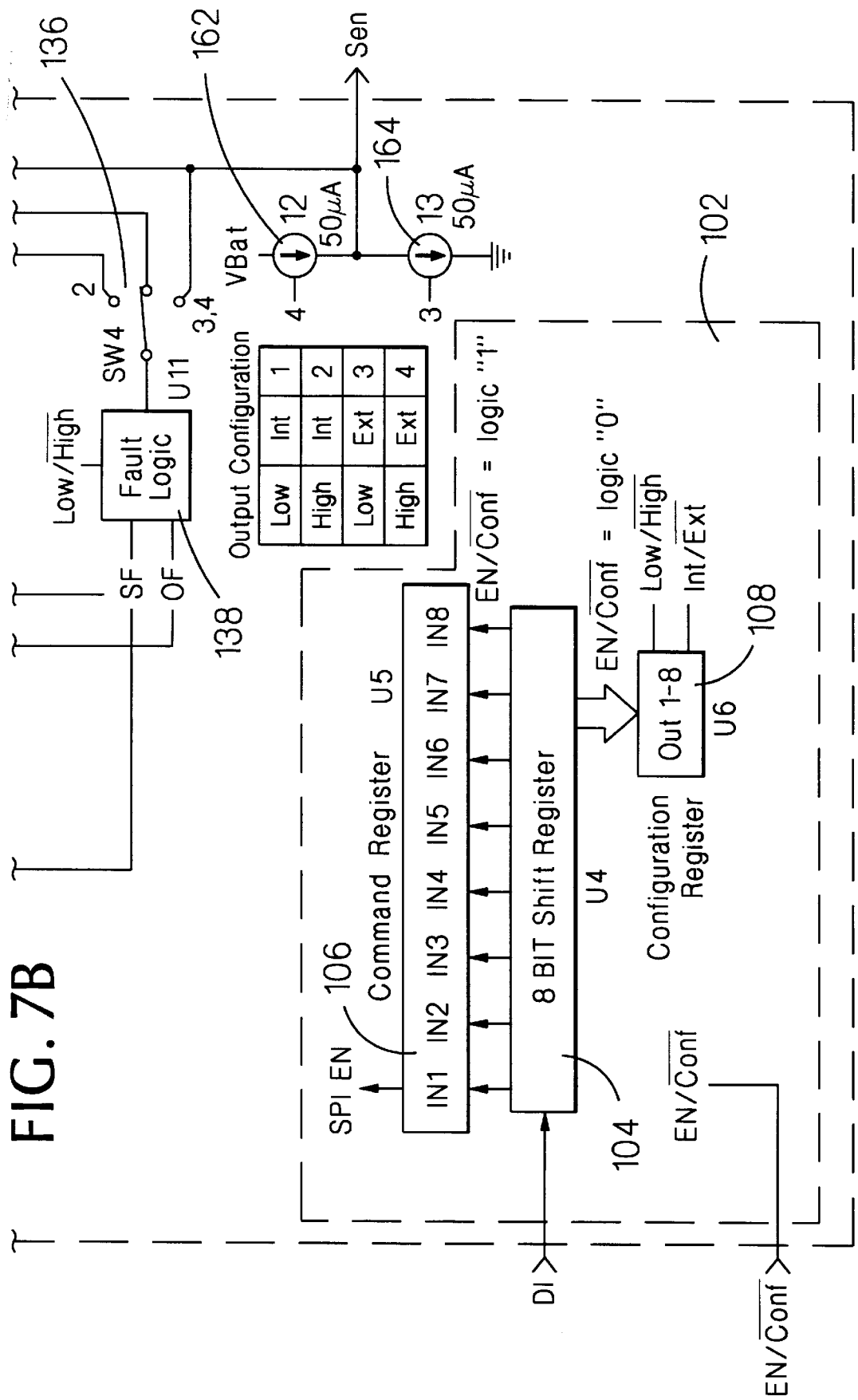

FIGS. 7A and 7B together illustrate the elements of basic circuit 10 with additional elements to configure the basic circuit in response to external control signals, the combined circuit being indicated generally by the reference numeral 100.

Circuit 100 includes input command and configuration control circuitry 102 which includes an 8 bit shift register (U4) 104 coupled to a command register (U5) 106 and to a configuration register (U6) 108. Only one output from U5 106 is used to configure the output driver portion of circuit 100, with the other outputs from U5 106 being used to configure other output drivers, if any (not shown), in the integrated circuit (IC) of which circuit 100 may be a part. For each configurable output driver in the IC, two SPI bits are required to configure each output correctly. One bit is used to select either a low or high side drive, and another bit is used to select either an internal or an external MOSFET gate drive. The SPI DI is initially routed to U5 106. When the En/Config bit is a logic "0", all eight outputs of U5 106 are disabled regardless of the contents of the command register and SPI data is routed to U6 108. The latter register must be properly configured once every power on cycle. The En/Config bit can subsequently be toggled to a logic "1", which allows the SPI DI input to be used to enable to disable the selected output channels of U5 106.

A discrete input command, "In", is wire OR'd with the SPI EN output bit from U5 106 in an OR gate (U7) 120. The output of this stage is AND'd in and AND gate (U8) 122 with the EN/Config input and with either an over-temperature shutdown discrete or a delayed short circuit fault discrete, the sources of which discretes are discussed below. The output of U8 122 enables wave-shaped gate drive (U1) 12, the operation of which gate drive is discussed above with reference to FIGS. 1–6.

A conventional current limit circuit (U9) 130 protects internal MOSFET 14 during fault conditions. A conventional over-temperature shutdown circuit (U10) 132 protects internal MOSFET 14 during prolonged fault conditions. The thermal shutdown is multiplexed with a delayed short circuit fault bit (external drive) through a switch (SW3) 134.

Both the Drain and Source of internal MOSFET 14 are connected to output pins. A Sense pin is also connected to an output pin and is internally multiplexed through a switch (SW4) 136 with the Drain and Source connections. Depending on which one of the four output configurations is desired, the output of the mux selects from which line to sense voltage (and adjust the polarity thereof) to correctly flag actual open or shorted fault conditions of the output load, with fault logic circuitry (U11) 138. An OR gate (U12) 140 outputs a logic "1" if any of the fault conditions are met, i.e., shorted or open load or thermal fault, which output may be used to activate additional circuitry (not shown) to indicate a fault condition. The thermal fault is not set when circuit 100 is configured as an external driver.

When circuit 100 is configured as an external MOSFET driver (FIGS. 4 and 5), switch (SW2) 26 shorts out the gate to source of internal MOSFET 14. The wave-shaped gate drive is now available of the Source pin and is connected to the gate of the external MOSFET. In addition, a shorted fault condition signal is routed through a time delay circuit (U13) 142, through a latch (U14) 144, then through SW3 134, through an inverter (U15) 146 for correct logic moding, and finally to AND gate (U8) 122. Once enabled, if a shorted output condition is sensed for over 300 microseconds at U13 142, U14 144 will be set which will disable the external MOSFET gate drive (turn off the device).

The shorted filter delay must be greater than the fault delay time, to guarantee that a shorted fault is latched before the channel is disabled (external driver only). The input command has to be cycled to the disable state in order to clear U14 144.

A current source/sink (11) 160 is used to supply a small amount of current to the output of internal MOSFET 14, in order to correctly identify open fault conditions. Similarly, a current source (12) 162 and a current sink (13) 164 are used to supply a small amount of current to the Sense pin, in order to correctly identify open fault conditions. Current source (12) 162 is enabled only when circuit 100 is configured as an external high side drive and current sink (13) 164 is enabled only when the circuit is configured as an external low side driver.

It will thus be seen that the objects set forth above, among those elucidated in, or made apparent from, the preceding description, are efficiently attained and, since certain changes may be made in the above construction without departing from the scope of the invention, it is intended that all matter contained in the above description or shown on the accompanying drawing figures shall be interpreted as illustrative only and not in a limiting sense.

It is also to be understood that the following claims are intended to cover all of the generic and specific features of the invention herein described and all statements of the scope of the invention which, as a matter of language, might be said to fall therebetween.

The embodiments of the invention in which an exclusive property or privilege is claimed are defined as follows:

1. A multi-configurable output driver for supplying current to an inductive load from a power source having a high voltage terminal and a low voltage terminal, comprising:
   (a) circuit means including a switching device to couple said power source to said inductive load;
   (b) said circuit means being configurable, without the addition or rearrangement of components, in an output topography selected from the group consisting of a low side output driver in which said switching device is connected between said inductive load and the low voltage terminal of said power source, and a high side output driver in which said switching device is connected between said inductive load and the high voltage terminal of said power source; and
   (c) means to select the output topography of said circuit means in response to input signals.

2. A multi-configurable output driver, as defined in claim 1, wherein said means to select includes:
   (a) means to receive a first input signal having first or second logic states;
   (b) in response to receiving said first input signal in said first logic state, said means to receive routes a second input to means to configure said circuit means in a selected output topography; and
   (c) in response to subsequently receiving said first input signal in said second logic state, said means to receive routes said second input to means to provide an enabling signal for said circuit means.

3. A multi-configurable output driver, as defined in claim 1, wherein: said circuit means includes means to provide a path to dissipate flyback current generated when said current is removed from said load, when said circuit means is configured in at least one of said high side output driver and low side output driver output topographies.

4. A multi-configurable output driver for supplying current to an inductive load, comprising:

(a) circuit means to provide driving current to said inductive load;
(b) said circuit means being configurable, without the addition or rearrangement of components, in an output topography selected from the group consisting of an internal low side output driver, an internal high side output driver, an external low side output driver, and an external high side output driver; and
(c) means to select the output topography of said circuit means in response to input signals.

5. A multi-configurable output driver, as defined in claim 4, wherein said means to configure includes;
   (a) means to receive a first input signal having first or second logic states;
   (b) in response to receiving said first input signal in said first logic state, said means to receive routes a second input to means to selectively configure said circuit means as either a low side or a high side driver and as either an internal or an external driver; and
   (c) in response to subsequently receiving said first input signal in said second logic state, said means to receive routes said second input to means to provide an enabling signal for said circuit means.

6. A multi-configurable output driver, as defined in claim 4, further comprising: means to provide an output signal indicative of an open or shorted condition when said circuit means is configured in any one of said four topographies.

7. A multi-configurable output driver, as defined in claim 6, wherein: said means to provide an output provides said output in response to an over-temperature condition when said circuit means is configured as an internal driver.

8. A multi-configurable output driver, as defined in claim 4, wherein said circuit means comprises:
   (a) first, second, and third output connections;
   (b) an internal MOSFET having its drain connected to said first output connection and its source connected to said second output connection;
   (c) a wave-shaped gate pre-drive circuit having an enable input and connected to drive said internal MOSFET through its gate;
   (d) said pre-drive circuit being selectively connected through a first switch either to a battery voltage or to a charge pumped battery voltage;
   (e) first and second zener diodes, having their anodes connected, connected in series between said gate of said internal MOSFET and said first output connection;
   (f) a second switch connected between said gate and said source of said internal MOSFET; and
   (g) a third zener diode is connected between said first and said third output connections.

9. A multi-configurable output driver, as defined in claim 8, wherein:
   (a) when said circuit means is configured as an internal low side driver driving a load, said first output connection is to be connected to a high side of said load, said first switch provides said battery voltage to said pre-drive circuit, said second switch is open, and said third output connection is to be connected to ground;
   (b) when said circuit means is configured as an internal high side output driver, said third output connection is to be connected to said high side of said load, said first switch provides said pumped battery voltage to said pre-drive circuit, said second switch is open, and said first output connection is to be connected to a voltage source;

(c) when said circuit means is configured as an external low side output driver, said high side of said load is to be connected to a voltage source, a low side of said load is to be connected to said second output connection and to a drain of an external MOSFET, said first switch provides said battery voltage to said pre-drive circuit, said second switch is closed, said third output connection is to be connected to a gate of said external MOSFET, a source of said external MOSFET is to be connected to ground, and said first output connection is to be left open circuited; and (d) when said circuit means is configured as an external high side output driver, said high side of said load is to be connected to said source of said external MOSFET and to said third output connection, said low side of said load is to be connected to ground, said first switch provides said pumped battery voltage to said pre-drive circuit, said second switch is closed, a voltage source is to be connected to said drain of said external MOSFET, said second output connection is to be connected to said gate of said external MOSFET, and said first output connection is to be left open.

10. A multi-configurable output driver, as defined in claim 9, further comprising, when said circuit means is configured as an external driver: means to sense a shorted fault condition of said external MOSFET and to disable said circuit means if said shorted fault condition exists for greater than a predetermined length of time.

* * * * *